United States Patent [19]

Morris

[11] Patent Number: 5,367,284

[45] Date of Patent: Nov. 22, 1994

[54] THIN FILM RESISTOR AND METHOD FOR MANUFACTURING THE SAME

[75] Inventor: Frank J. Morris, Plano, Tex.

[73] Assignee: Texas Instruments Incorporated, Dallas, Tex.

[21] Appl. No.: 62,526

[22] Filed: May 10, 1993

[51] Int. Cl.[5] .................... H01C 1/012; H01L 21/00
[52] U.S. Cl. ................................. 338/306; 338/307; 338/314; 156/643
[58] Field of Search ............... 338/306, 307, 308, 309, 338/314; 29/620; 156/643, 659.1

[56] References Cited

U.S. PATENT DOCUMENTS 4,676,867  6/1987  Elkins et al. ..................... 156/643
4,968,964  11/1990 Nagai et al. ...................... 338/307 X

OTHER PUBLICATIONS

Ghandi, *VLSI Fabrication Principles*, John Wiley & Sons, N.Y., 1983, pp. 582–585.

*Primary Examiner*—Marvin M. Lateef
*Attorney, Agent, or Firm*—Brian A. Carlson; James C. Kesterson; Richard L. Donaldson

[57] ABSTRACT

An inverted thin film resistor structure comprises a metallic interconnect layer having predetermined patterns delineating two or more metallic interconnect leads (e.g. Al 36) overlaying a supporting layer (e.g. $SiO_2$ 32), an interlevel dielectric layer (e.g. $SiO_2$ 40) overlaying the supporting layer, and planarized so as to expose a top contact portion of the metallic interconnect leads, and an inverted thin film resistor (e.g. TaN 44) overlaying a portion of the planarized interlevel dielectric layer and overlaying the exposed top contact portion of the metallic interconnect leads. The novel inverted thin film resistor structure does not require a protective metal layer and does not require any vias in direct contact with the resistor. In addition, both the thin film resistor and the metallic interconnect can be formed with pattern and etch techniques. Improved resistor control and reliability are generally achieved since the resistor film is deposited on a substantially planar surface, and resistor length is determined by the spacing of the metallic leads rather than the size of the vias.

27 Claims, 3 Drawing Sheets

THIN FILM RESISTOR AND METHOD FOR MANUFACTURING THE SAME

FIELD OF THE INVENTION

This invention generally relates to integrated circuits, and in particular to thin film resistors and methods for manufacturing the same.

BACKGROUND OF THE INVENTION

Resistive thin films such as TaN are often used as resistors in semiconductor (e.g. GaAs, Si) applications. These resistor films can be sputtered or evaporated onto a wafer and then etched selectively. Alternately these resistor films can be delineated by means of a photoresist lift-off process. Current technology for connecting to thin film resistors falls primarily into two categories. The first utilizes lift-off metallic interconnects, and the second utilizes etched metallic interconnects with an interlevel dielectric and etched vias.

Generally, in the lift-off interconnect process, a thin film resistor is defined by etching or lift-off. Photoresist is applied and patterned, leaving the contact regions of the resistor exposed. Then a metallic layer for the interconnect is deposited and unwanted portions are lifted off. This process is straightforward but can be used only in limited applications where the metallic interconnects can be defined by lift-off.

Generally, in the etched interconnect process, a thin film resistor is formed by etching or lift-off. Then a lift-off material (e.g. photoresist) is used to deposit protective metal over the contact regions of the resistor. This metal is not the metallic interconnect, but is used instead to protect the thin film resistor during subsequent via etching. An interlevel dielectric is then deposited, followed by a patterning and etching of vias in the dielectric, stopping on the protective metal over the thin film resistor. Finally the metallic interconnect material is deposited, then patterned and etched. This process requires two masks for making the resistor structure; the first mask defines the resistor and the second mask defines the protective metal over the contact regions.

SUMMARY OF THE INVENTION

Thin film resistor materials are often etched by the same processes used for etching metallic interconnects and/or interconnect vias. To protect the thin film resistors during these processes often requires the use of complex methods such as the use of protective metal films deposited over the resistor where subsequent connections are to be made. Generally, in the prior art, thin film resistor material is deposited and patterned by lift-off or etching. A protective metallic film is selectively deposited, using a lift-off process, over the ends of the resistor. This serves to protect the resistor during subsequent interconnect via etch processing which enables contacts to be made to the resistor. This extra processing can be costly.

In accordance with the present invention, there is provided a method by which a thin film resistor structure is formed without using a protective metal layer and without requiring the resistor to be an etch stop. In addition, both the thin film resistor and the metallic interconnect can be formed with pattern and etch techniques. Instead of forming the thin film resistor first, the metallic interconnect is formed before depositing the resistive thin film. As used herein, the term "inverted", when used in reference to a thin film resistor, means a thin film resistor that connects portions of its lower surface to portions of the top surface of its associated metallic interconnect leads. The metallic interconnect material is deposited on the substrate or on a lower dielectric layer, then patterned and etched using standard semiconductor processes. An interlevel dielectric, which is generally required for subsequent levels of interconnect and which need not be patterned, is deposited over the patterned metallic leads. Using any of several planarizing processes utilized by modern multilevel metallic interconnect processes, the interlevel dielectric is partially etched back in order to planarize it. The top surfaces of the metallic interconnect leads are exposed during this etch back process. Then the resistive layer is deposited, and the resistor is formed by photolithographic patterning and etching, or by a lift-off process. The inverted thin film resistor makes contact to the exposed metallic interconnect leads and therefore generally requires no special etch. The patterning of the inverted thin film resistor is generally followed by the deposition of an upper level dielectric layer that is part of the normal multilevel interconnect processes.

One embodiment of this invention comprises a metallic interconnect layer having predetermined patterns delineating two or more metallic interconnect leads overlaying a supporting layer, an interlevel dielectric layer overlaying the supporting layer, and planarized so as to expose a top contact portion of the metallic interconnect leads, and an inverted thin film resistor overlaying a portion of the planarized interlevel dielectric layer and overlaying the exposed top contact portion of the metallic interconnect leads. The novel inverted thin film resistor structure does not require a protective metal layer and does not require any vias in direct contact either with the resistor or with the portion of the interconnect which contacts the resistor. A method of forming an embodiment of this invention comprises the steps of forming a metallic interconnect layer having predetermined patterns delineating two or more metallic interconnect leads on a supporting layer, forming an interlevel dielectric layer on the metallic interconnect layer and the supporting layer, planarizing the interlevel dielectric layer so as to expose a top contact portion of the metallic interconnect leads, and forming an inverted thin film resistor on the planarized interlevel dielectric layer and on the exposed top contact portion of the metallic interconnect leads.

Some of the advantages of this novel inverted thin film resistor method and structure are:

A. Etch stops do not need to be located over the thin film resistor contact regions.

B. Thin film resistors may be photolithographically defined and etched rather than be defined by lift-off. Many thin film resistor deposition processes use sputtered films which are generally difficult to lift-off.

C. Resistor length is determined by the spacing of the metallic leads rather than the size of the vias for improved resistor control and reliability.

D. The resistor film is deposited on a substantially planar surface for improved resistor control and reliability.

E. This process can be repeated after deposition of the second metallic interconnect layer in order to provide different sheet resistance films. For example, level one thin film resistors can be made from a low sheet resistivity film while level two thin film resistors can be made from a high sheet resistivity film.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
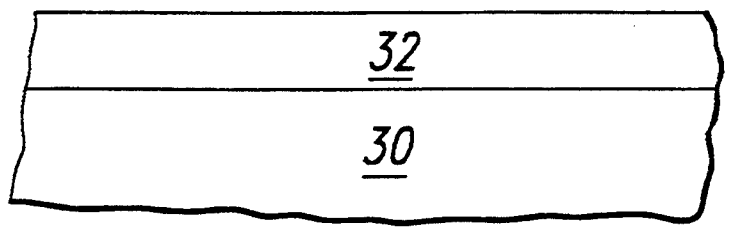
FIGS. 1-8 are cross-sectional views of a method for constructing an inverted thin film resistor and its associated electrical connections on a semiconductor substrate.
Figure 2:
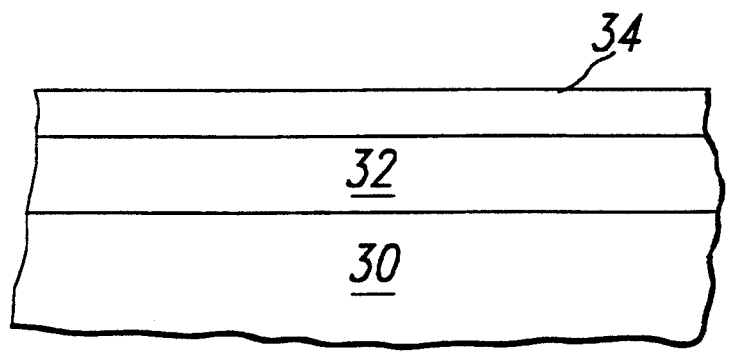
Figure 3:
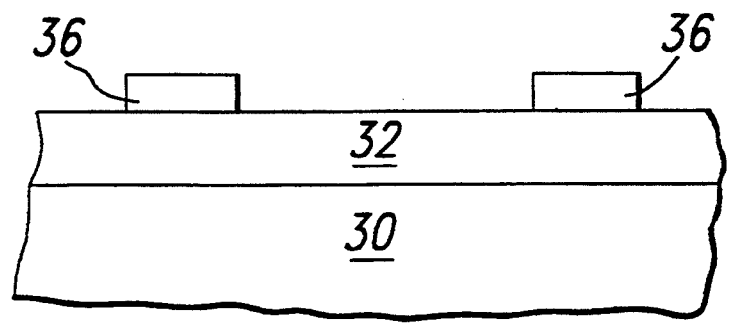
Figure 4:
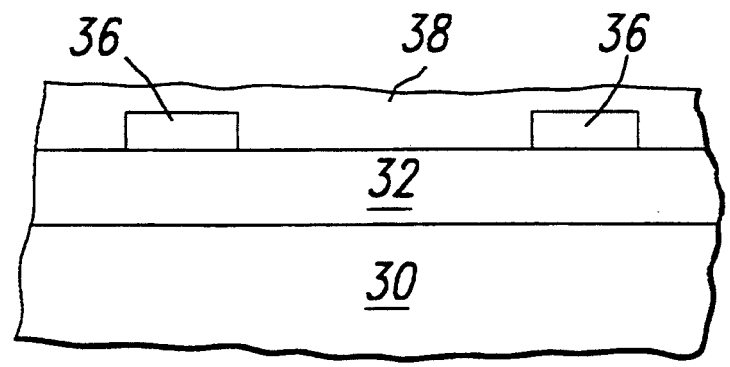
Figure 5:
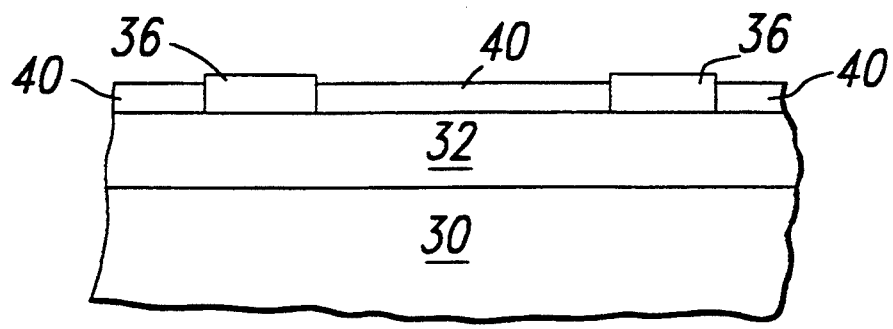
Figure 6:
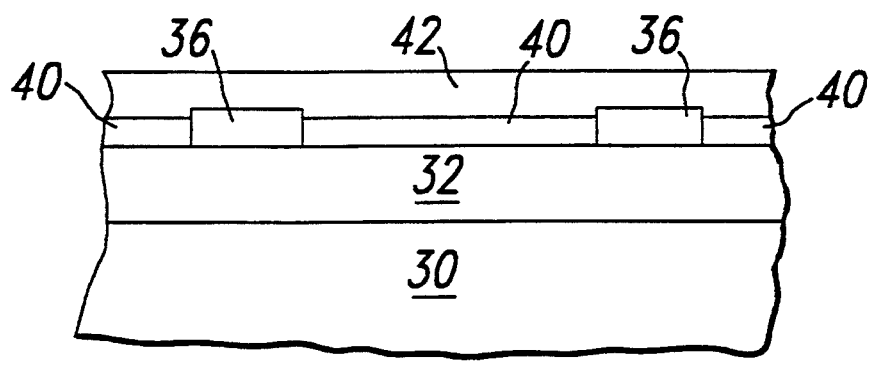
Figure 7:
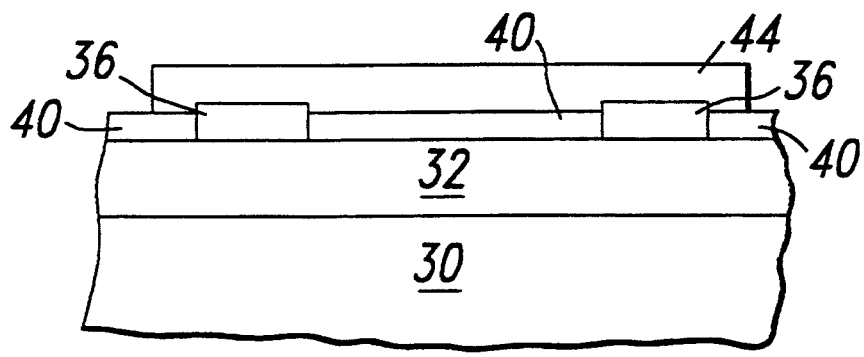
Figure 8:
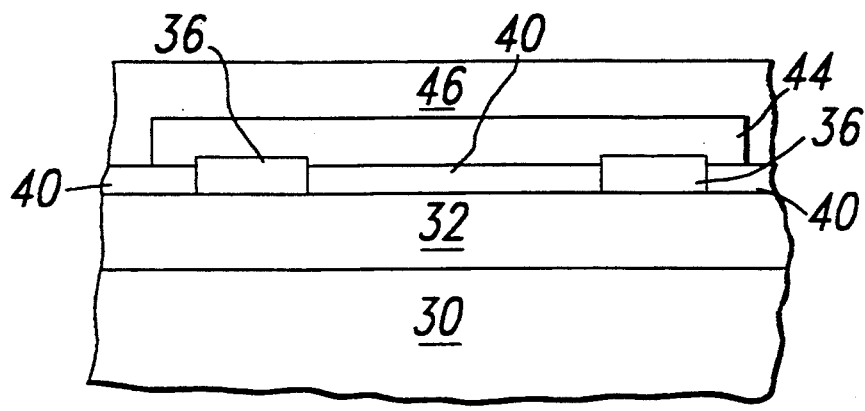

With reference to FIGS. 1-8, there is shown a method of forming a preferred embodiment of this invention, an inverted thin film resistor and its associated electrical connections. FIG. 1 illustrates an SiO₂ lower level dielectric layer 32 formed on the surface of a GaAs substrate 30. FIG. 2 illustrates an aluminum metallic layer 34 deposited on the SiO₂ lower level dielectric layer 32. The Al layer 34 is then photolithographically patterned and etched, forming the two Al metallic interconnect leads 36 which are illustrated in FIG. 3. Alternatively, the Al leads 36 may be formed using photoresist lift-off techniques. FIG. 4 illustrates an SiO₂ interlevel dielectric layer 38 deposited on the SiO₂ lower level dielectric 32 and on the Al leads 36. The interlevel dielectric 38 is deposited such that it essentially covers the Al leads 36. Using e.g., a photoresist etchback process, the SiO₂ interlevel dielectric 38 is planarized, exposing the top portion of the Al leads 36 as illustrated in FIG. 5. The Al leads 36 are exposed preferably between 1 and 1000 angstroms, more preferably between 300 and 700 angstroms, and most preferably between 450 and 550 angstroms, above the planarized dielectric 40. FIG. 6 illustrates a TaN resistive layer 42 deposited (e.g. by sputtering or evaporation) on the SiO₂ planarized dielectric 40 and on the exposed Al leads 36. The TaN resistive layer 42 is then photolithographically patterned and etched, forming the TaN inverted thin film resistor 44 which is illustrated in FIG. 7. The TaN resistive layer 42 is etched in CF₄/O₂ which generally etches the TaN without significantly etching the SiO₂ planarized interlevel dielectric 40 or the Al leads 36, although some incidental etching may occur. The TaN resistor 44 connects directly to the Al leads 36, so special etch stops or etched vias are generally not required for the TaN resistor 44. Alternatively, the TaN resistor 44 may be formed using photoresist lift-off techniques. FIG. 8 illustrates an SiO₂ upper level dielectric layer 46 deposited on the SiO₂ planarized interlevel dielectric 40, the exposed portion of the Al interconnect leads 36, and the TaN resistor 44, thus effectively shielding the TaN inverted thin film resistor structure during subsequent processing.

Figure 9:
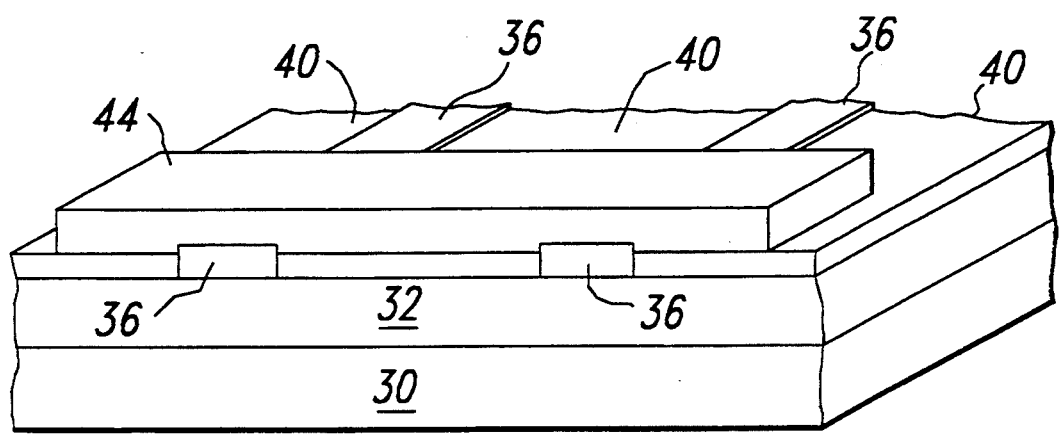
FIG. 9 is a perspective view of an inverted thin film resistor and its associated electrical connections formed on a conductor substrate.

FIG. 9 illustrates a perspective view of the inverted thin film resistor structure without the upper level dielectric layer 46. The exposed Al interconnect leads 36 can be seen to extend out from under the thin film resistor 44. Once the upper level dielectric layer 46 is deposited, further connection to the Al leads 36 can be made without disturbing the inverted thin film resistor 44.

The sole table, below, provides an overview of some embodiments and the drawings.

TABLE

| Drawing Element | Generic Term | Preferred or Specific Examples | Other Alternate Examples |
|---|---|---|---|
| 30 | Semiconductor substrate | GaAs | Other compound semiconductors (e.g. InP, Si/Ge, SiC) Single component semiconductors (e.g. silicon, diamond) Ceramic substrates |
| 32 | Lower level dielectric | SiO₂ | Other dielectrics or combinations of dielectrics (e.g. Si₃N₄, SiO₂/Si₃N₄) This layer may or may not be used |
| 34 | Metallic layer | Al | Other conductive metals and combinations thereof (e.g. Au, Cu, Ti, W) |
| 36 | Metallic interconnect leads | | Conductive metallic compounds/mixtures and combinations thereof (e.g. AlCu, TiW/Au) |
| 38 | Interlevel dielectric layer | SiO₂ | Other dielectrics or combinations of dielectrics (e.g. Si₃N₄, SiO₂/Si₃N₄) |
| 40 | Planarized interlevel dielectric | | |
| 46 | Upper level dielectric | | |
| 42 | Resistive layer | TaN | Other resistive thin film materials and combinations thereof (e.g. Cermet, TiN, TiW) |
| 44 | Inverted thin film resistor | | |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a microelectronic inverted thin film resistor structure, said method comprising:
    (a) forming a metallic interconnect layer having predetermined patterns delineating two or more metallic interconnect leads, on a supporting layer;
    (b) forming an interlevel dielectric layer on said metallic interconnect layer and said supporting layer;

(c) planarizing said interlevel dielectric layer so as to expose a top contact portion of said metallic interconnect leads between 1 and 1000 angstroms above said interlevel dielectric layer; and (d) forming an inverted thin film resistor on said planarized interlevel dielectric layer and on said exposed top contact portion of said metallic interconnect leads, whereby said inverted thin film resistor structure does not require a protective metal layer on said resistor and does not require said resistor to be an etch stop for subsequent processing.

2. The method according to claim 1, said method further comprising forming an upper level dielectric layer on and substantially covering said inverted thin film resistor structure.

3. The method according to claim 1, wherein said inverted thin film resistor formation comprises the steps of:

(a) depositing a resistive layer; and (b) photolithographically defining and etching a predetermined resistor pattern in said resistive layer.

4. The method according to claim 1, wherein said resistor has a length defined by a predetermined spacing between said top contact portion of said leads.

5. The method according to claim 1, wherein said supporting layer is a lower level dielectric layer.

6. The method according to claim 1, wherein said supporting layer is a semiconductor substrate.

7. The method according to claim 1, wherein said metallic interconnect layer is selected from the group consisting of: Al, Au, Cu, Ti, W, AlCu, TiW/Au, and combinations thereof.

8. The method according to claim 1, wherein said inverted thin film resistor is selected from the group consisting of: TaN, Cermet, TiN, TiW, and combinations thereof.

9. The method according to claim 1, wherein said interlevel dielectric layer is selected from the group consisting of: $SiO_2$, $Si_3N_4$, and combinations thereof.

10. The method according to claim 1, wherein said interlevel dielectric planarizing exposes said top contact portion of said interconnect leads between 300 and 700 angstroms above said interlevel dielectric layer.

11. The method according to claim 1, wherein said interlevel dielectric planarizing exposes said top contact portion of said interconnect leads between 450 and 550 angstroms above said interlevel dielectric layer.

12. The method according to claim 1, wherein said resistor is formed by photolithographic defining and etching.

13. A microelectronic inverted thin film resistor structure comprising:

a substantially planar interlevel dielectric layer overlaying a supporting layer;

a metallic interconnect layer having predetermined patterns delineating two or more metallic interconnect leads overlaying said supporting layer, wherein an exposed portion of said leads extends between 1 and 1000 angstroms above said dielectric layer; and an inverted thin film resistor overlaying a portion of said planar interlevel dielectric layer and overlaying said exposed portion of said metallic interconnect leads, wherein said inverted thin film resistor structure does not contain a protective metal layer on said resistor and does not contain any vias in direct contact with said resistor.

14. The structure of claim 13, said structure further comprising an upper level dielectric layer on and substantially covering said inverted thin film resistor structure.

15. The structure of claim 13, wherein said supporting layer is a lower level dielectric layer.

16. The structure of claim 13, wherein said supporting layer is a semiconductor substrate.

17. The structure of claim 13, wherein said metallic interconnect layer is selected from the group consisting of: Al, Au, Cu, Ti, W, AlCu, TiW/Au, and combinations thereof.

18. The structure of claim 13, wherein said inverted thin film resistor is selected from the group consisting of: TaN, Cermet, TiN, TiW, and combinations thereof.

19. The structure of claim 13, wherein said interlevel dielectric layer is selected from the group consisting of: $SiO_2$, $Si_3N_4$, and combinations thereof.

20. The structure of claim 13, wherein said exposed portion of said interconnect leads extends between 300 and 700 angstroms above said interlevel dielectric layer.

21. The structure of claim 13, wherein said exposed portion of said interconnect leads extends between 450 and 550 angstroms above said interlevel dielectric layer.

22. The structure of claim 13, wherein said resistor has a length defined by a predetermined spacing between said exposed portion of said leads.

23. A method of fabricating microelectronic inverted thin film resistor structures, said method comprising:

(a) forming a first inverted thin film resistor structure comprising the steps of:

(i) forming a metallic interconnect layer having predetermined patterns delineating two or more metallic interconnect leads, on a supporting layer;

(ii) forming an interlevel dielectric layer on said metallic interconnect layer and said supporting layer;

(iii) planarizing said interlevel dielectric layer so as to expose a top contact portion of said metallic interconnect leads; and (iv) forming an inverted thin film resistor on said planarized interlevel dielectric layer and on said exposed top contact portion of said metallic interconnect leads;

(b) forming an upper level dielectric layer on and substantially covering said first inverted thin film resistor structure; and (c) forming a second inverted thin film resistor structure on said upper level dielectric layer.

24. The method according to claim 23, wherein said first and second inverted thin film resistor structures comprise different sheet resistances.

25. The method according to claim 23, wherein said inverted thin film resistor formation comprises the steps of:

(a) depositing a resistive layer; and (b) photolithographically defining and etching a predetermined resistor pattern in said resistive layer.

26. The method according to claim 23, wherein said interlevel dielectric planarizing exposes said top contact portion of said interconnect leads between 300 and 700 angstroms above said interlevel dielectric layer.

27. The method according to claim 23, wherein said interlevel dielectric planarizing exposes said top contact portion of said interconnect leads between 450 and 550 angstroms above said interlevel dielectric layer.

* * * * *